(12) United States Patent
Pan

(10) Patent No.: US 6,714,462 B2
(45) Date of Patent: Mar. 30, 2004

(54) METHOD AND CIRCUIT FOR GENERATING CONSTANT SLEW RATE OUTPUT SIGNAL

(75) Inventor: Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/232,090

(22) Filed: Aug. 29, 2002

(65) Prior Publication Data

US 2004/0041607 A1 Mar. 4, 2004

(51) Int. Cl.[7] .................................................. G11C 7/00
(52) U.S. Cl. ........................... 365/189.05; 365/230.06
(58) Field of Search ........................ 365/189.05, 230.06

(56) References Cited

U.S. PATENT DOCUMENTS 5,191,269 A * 3/1993 Carbolante
5,568,081 A * 10/1996 Lui et al. .................... 327/380
6,236,248 B1 * 5/2001 Koga ......................... 327/112

* cited by examiner

Primary Examiner—M. Tran
(74) Attorney, Agent, or Firm—Snell & Wilmer L.L.P.

(57) ABSTRACT

An improved output buffer having a substantially constant slew rate comprises a slew rate control circuit and an output driver circuit. The slew rate control circuit is configured at the input terminals of the output driver circuit to suitably control the slew rate of the input signal for the output driver circuit based on the level of voltage of a power supply for the output driver circuit. For increases in the voltage of the power supply, the slew rate of the input signal of the output driver circuit is decreased, while for decreases in the voltage of the power supply, the slew rate of the input signal of the output driver circuit is increased, such that the variation of the slew rate of the output signal of the output buffer is significantly reduced.

44 Claims, 3 Drawing Sheets

METHOD AND CIRCUIT FOR GENERATING CONSTANT SLEW RATE OUTPUT SIGNAL

TECHNICAL FIELD

The present invention relates, generally, to memory systems. More particularly, the present invention relates to an output buffer, such as may be utilized for memory applications.

BACKGROUND OF THE INVENTION

In the efforts for optimizing and creating new operations in various high-speed microcontroller-based devices, such as portable personal computers (PCs), personal digital assistants (PDAS) and the like, significant attention has been given to the further improvement of memory devices.

Most new microprocessor-based applications are configured for high processing speed through implementation of dynamic random access memory (DRAM) devices, including synchronous dynamic random access memory (SDRAM) devices that can operate at significantly higher clock speeds than conventional memory devices. In particular, SDRAM devices are synchronized with the clock speed in which the microprocessor is optimized, thus enabling the number of instructions that the microprocessor can perform at a given time to be increased.

With reference to FIGS. 1A and 1B, an output buffer 100 as may be implemented within an SDRAM device comprises a pair of predriver circuits 102 and 104 and output driver devices 106. A control logic and pull-up predriver circuit 102 is provided for controlling and driving a pull-up transistor $M_{P0}$, while a control logic and pull-down predriver circuit 104 is provided for controlling and driving a pull-down transistor $M_{N0}$. Pull-up/down transistors $M_{P0}$ and $M_{N0}$ are further connected to a bondpad 108. Control logic and predriver circuits 102 and 104 can be configured with an internally supplied voltage $V_{CCR}$ (or I/O power supply $V_{CCQ}$) to drive the gates of pull-up/down transistors $M_{P0}$ and $M_{N0}$ to provide an output signal.

An important characteristic in the design and operation of DRAM devices is the slew rate performance of the output buffers within the DRAM devices. The slew rate is the rate from which the output from an electronic circuit or device can be driven from one limit to another over the dynamic range of the electronic circuit or device. For DRAM devices, an ideal slew rate is between approximately 2 to 4 volts/nanosecond. The slew rate of the output signal of the output buffers in DRAM applications can significantly affect various timing specifications, including TAC, TDQSQ, and the like. As a result, it is desirable for the slew rate to be relatively constant for such output buffers.

Unfortunately, the slew rate of the output signal of such output buffers is often varied by the power supply, as well as process and temperature variations within the DRAM device. Of these reasons, changes in the power supply is the biggest impediment to constant slew rate operation. For example, for a change in power supply voltage from 2.3 volts to 2.7 volts, the slew rate of the output signal can vary by approximately 40–50% or more.

SUMMARY OF THE INVENTION

In accordance with various aspects of the present invention, a memory system includes an output buffer with an output signal having a substantially constant slew rate. In accordance with an exemplary embodiment, the output buffer comprises a slew rate control circuit and an output driver circuit. The slew rate control circuit is configured at the input terminals of the output driver circuit, for example between a predriver circuit and the output driver circuit. The slew rate control circuit is configured to suitably control the slew rate of an input signal for the output driver circuit, for example an input signal provided by a predriver circuit, based on the level of voltage of a power supply for the output driver circuit. For increases in the voltage of the power supply, the slew rate of the input signal of the output driver circuit is decreased by the slew rate control circuit, while for decreases in the voltage of the power supply, the slew rate of the input signal of the output driver circuit is increased by the slew rate control circuit. As a result of controlling the slew rate of the input signal of the output driver circuit, the variation of the slew rate of the output signal of the output buffer is significantly reduced.

In accordance with an exemplary embodiment, the slew rate control circuit comprises a first amplifier circuit for controlling the slew rate of an input signal provided to a pull-up element of the output driver circuit, and a second amplifier circuit for controlling the slew rate of an input signal provided to a pull-down element of the output driver circuit. The amplifier circuits can also be configured with current sources configured to facilitate control of the slew rate of the input signals provided to the pull-up and pull-down elements of the output driver circuit based on the level in voltage in the power supply. In an exemplary embodiment, the amplifier circuits comprise operational transconductance amplifiers (OTA's) having voltage-controlled current sources configured for controlling the biasing current for the OTA's based on the level in voltage in the power supply.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF THE EMBODIMENTS OF THE PRESENT INVENTION

The present invention may be described herein in terms of various functional components. It should be appreciated that such functional components may be realized by any number of hardware or structural devices configured to perform the specified functions. For example, the present invention may employ various integrated components, e.g., buffers, supply references, current sources, signal conditioning devices and the like, comprised of various electrical devices, e.g., resistors, transistors, capacitors, diodes and other components whose values may be suitably configured for various intended purposes. In addition, the present invention may be practiced in any integrated circuit application where an output buffer can be utilized. However for purposes of illustration only, exemplary embodiments of the present invention are described herein in connection with a memory chip application, such as for a DRAM device. Further, it should be noted that while various components may be suitably coupled or connected to other components within exemplary circuits, such connections and couplings can be realized by direct connection between components, or by connection or coupling through other components and devices located thereinbetween.

Figure 1:
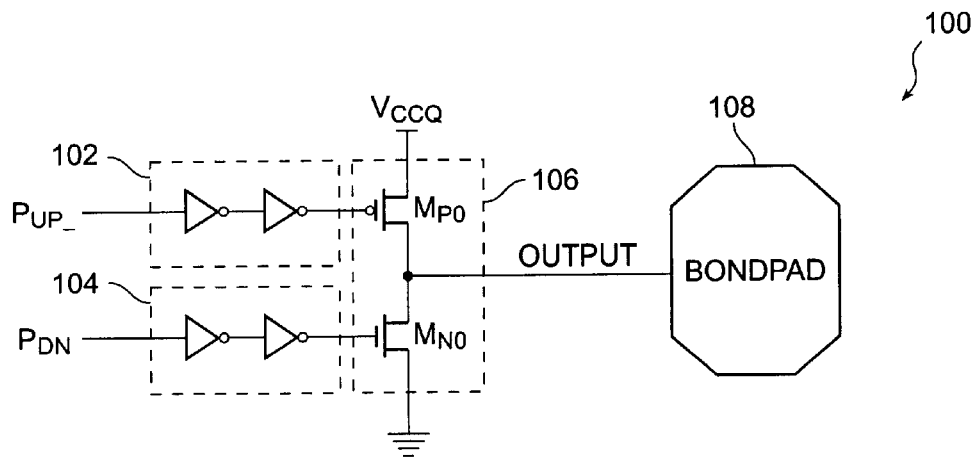
FIG. 1 illustrates a block diagram of prior art output buffers with control and predriver circuits.
Figure 2A:
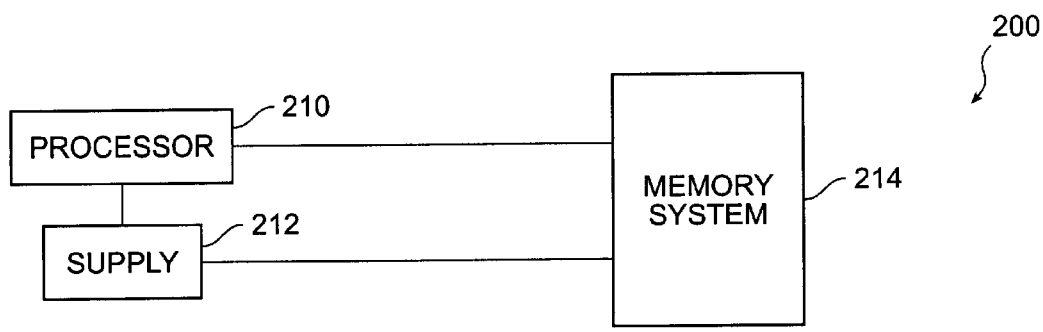
FIGS. 2A and 2B illustrate block diagrams of exemplary embodiments of an electronic system with a memory system in accordance with the present invention.

An electronic system according to various aspects of the present invention includes a plurality of components operating in conjunction with a supply regulation circuit. The components may comprise any components using a supply regulation circuit, such as multiple integrated circuits and electrical components on a single board, various elements in a single integrated circuit, various components of a computer system, or any other components. For example, with reference to a block diagram illustrated in FIG. 2A, an exemplary electronic system 200 suitably comprises a computer having a processor 210, a supply 212, and a memory system 214. Processor 210 controls the electronic system 200, such as in accordance with a program. Processor 210 may comprise any controlling element, for example a conventional central processing unit, such as an Intel Pentium processor or an Advanced Micro Devices Athlon processor.

Supply 212 provides power to the various components of electronic system 200, including processor 210 and memory system 214. Supply 212 may comprise any source of power for electronic system 200, such as a conventional electric power supply, a charge pump, and/or other power supplies. In the present embodiment, supply 212 is connected to processor 210 and is configured to supply at least two voltage levels. Although the present embodiment includes the processor 210, supply 212, and memory system 214, electronic system 200 may include any suitable components.

Figure 2B:
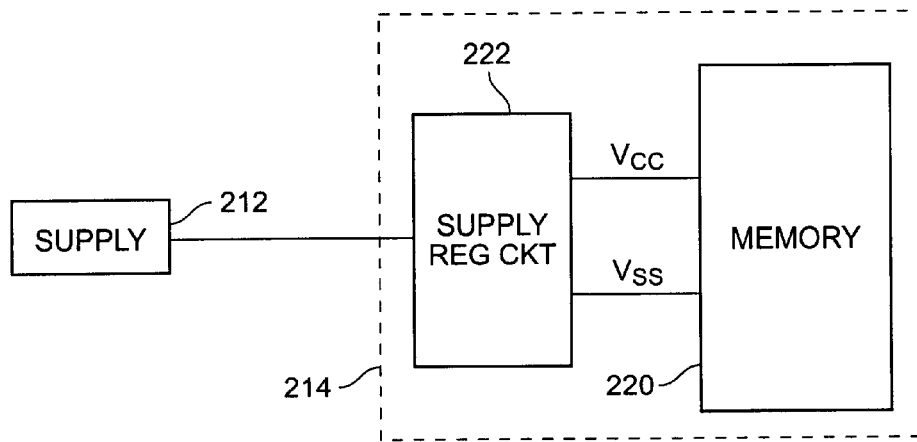

Memory system 214 stores information for subsequent retrieval. Memory system 214 may comprise any appropriate memory, memory system, or storage device or system. Memory system 214 may comprise or be supplemented by any component or system drawing power from supply 212. Memory system 214 is suitably connected to processor 210 and configured to provide information to processor 210. For example, with reference to FIG. 2B, memory system 214 of the present embodiment suitably comprises a memory 220 and a supply regulation circuit 222. Memory 220 comprises any suitable system for storing data for later retrieval, such as a memory subsystem including a memory controller, multiple memory chips, and associated logic and circuitry. In the present embodiment, memory 220 comprises a DRAM, such as an SDRAM available from Micron Technology, Inc. Memory 220 suitably includes multiple word lines and bit lines used to store information at selected addresses in memory 220.

Supply regulation circuit 222 controls the supply levels to one or more components of electronic system 200, such as memory 220. In the present embodiment, supply regulation circuit 222 is integrated into memory 220, though supply regulation circuit 222 may be integrated into other components of memory 220 or implemented as a separate circuit. Supply regulation circuit 222 according to various aspects of the present invention provides selected voltage levels to memory 220. In particular, supply regulation circuit 222 is connected to supply 212 to receive power and may be configured to generate, monitor, and regulate one or more particular voltages for memory 220. Supply regulation circuit 222 may comprise any suitable supply regulation circuit, such as a voltage control circuit, current control circuit, or any other supply regulation circuit or suitable combination of circuits. In the present embodiment, supply regulation circuit 222 is configured with an output buffer for regulating voltages within memory 220.

In accordance with various aspects of the present invention, memory system 214 includes an output buffer with an output signal having a substantially constant slew rate. In accordance with an exemplary embodiment, the output buffer comprises a slew rate control circuit and an output driver circuit. The slew rate control circuit is configured at the input terminals of the output driver circuit, for example between a predriver circuit and the output driver circuit. The slew rate control circuit is configured to suitably control the slew rate of an input signal for the output driver circuit, for example a pull-up signal and/or a pull-down signal provided by a predriver circuit, based on the level of voltage of a power supply for the output driver circuit. As a result of controlling the slew rate of the input signal of the output driver circuit, the variation of the slew rate of the output signal of the output buffer is significantly reduced.

Figure 3:
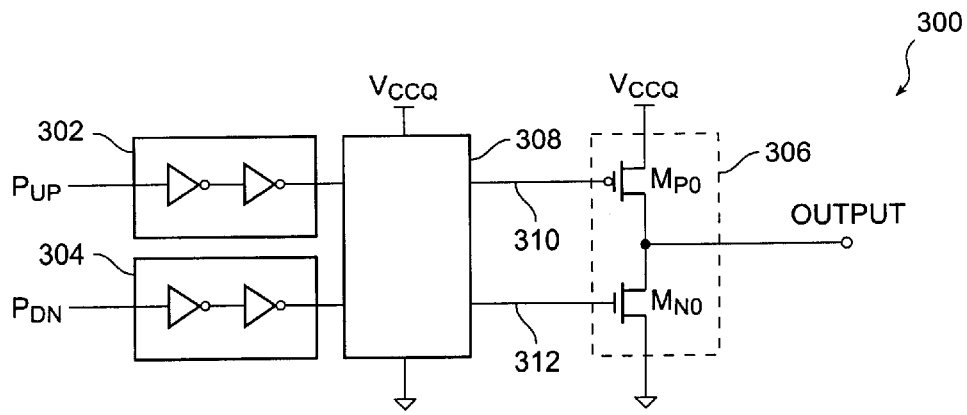
FIG. 3 illustrates a block diagram of an exemplary output buffer having a slew rate control circuit in accordance with the present invention.

With reference to FIG. 3, an exemplary output buffer 300 comprises a pair of predriver circuits 302 and 304, an output driver circuit 306, and a slew rate control circuit 308. A control logic and pull-up predriver circuit 302 is configured for providing an input signal, e.g., a pull-up signal $P_{UP}$, for controlling and driving a pull-up element of output driver circuit 306, while a control logic and pull-down predriver circuit 304 is configured for providing an input signal, e.g., a pull-down signal $P_{DOWN}$, for controlling and driving a pull-down element of output driver circuit 306. Predriver circuits 302 and 304 suitably comprise various logic devices and components for providing pull-up and/or pull-down signals $P_{UP}$ and $P_{DOWN}$. For example, predriver circuits 302 and 304 can comprise a pair of inverter devices in series, and/or various AND gates, NAND gates, OR gates, exclusive-OR gates, in series and/or parallel to provide pull-up and/or pull-down signals $P_{UP}$ and $P_{DOWN}$. In addition, predriver circuits 302 and 304 can be configured within a single predriver circuit, and/or can be configured separate from output buffer 300, i.e., an exemplary predriver circuit can comprise two predriver circuits 302 and 304 or a single predriver circuit for providing pull-up and/or pull-down signals $P_{UP}$ and $P_{DOWN}$, either configured within, or separate from, output buffer 300.

Output driver circuit 306 suitably comprises a pull-up element and a pull-down element for driving an output signal OUTPUT. In the exemplary embodiment, the pull-up and pull-down elements comprise metal-oxide-silicon field-effect transistors (MOSFET's), with the pull-up element suitably comprising a pull-up element transistor $M_{P0}$ and the pull-down element suitably comprising a pull-down transistor $M_{N0}$. Pull-up transistor $M_{P0}$ includes a source terminal coupled to a power supply $V_{CCQ}$, while pull-down transistor $M_{N0}$ includes a source terminal coupled to ground, with the respective drain terminals connected together for providing output signal OUTPUT. Although output driver circuit 306 illustrates a p-channel pull-up transistor and an n-channel pull-down transistor, output driver circuit 306 can also suitably comprise a pair of n-channel devices for the pull-up element and the pull-down element. Moreover, output driver circuit 306 can also suitably comprise other types of transistor devices, such as bipolar-junction transistors (BJT's), and can comprise any output driver configuration, now known or hereinafter developed, for driving an output signal OUTPUT.

Slew rate control circuit 308 is coupled to the input terminals of output driver circuit 306, for example, configured between predriver circuits 302 and 304 and output driver circuit 306. Slew rate control circuit 308 receives the pull-up and/or pull-down signals $P_{UP}$ and $P_{DOWN}$ from predriver circuits 302 and 304 and provides a pair of controlled input signals 310 and 312 for driving pull-up transistor $M_{P0}$ and pull-down transistor $M_{N0}$. Slew rate control circuit 308 is configured to suitably control the slew rate of input signals 310 and 312 for output driver circuit 306 based on the level of voltage of power supply $V_{CCQ}$ for output driver circuit 306.

For example, for increases in the voltage of power supply $V_{CCQ}$, the slew rates of input signals 310 and 312 of output driver circuit 306 are decreased by slew rate control circuit 308, while for decreases in the voltage of power supply $V_{CCQ}$, the slew rates of input signals 310 and 312 of output driver circuit 306 are increased by slew rate control circuit 308. The slew rate of output signal OUTPUT of output driver circuit 306 suitably corresponds to the slew rate of the input signals 310 and 312. In other words, decreasing the slew rate of input signals 310 and/or 312 decreases the slew rate of output signal OUTPUT, and increasing the slew rate of input signals 310 and/or 312 decreases the slew rate of output signal OUTPUT. As a result, the variation of the slew rate of output signal OUTPUT of output buffer 306 is significantly reduced, and a substantially constant slew rate of output signal OUTPUT can be realized.

Slew rate control circuit 308 can be configured in various manners for controlling the slew rate of output signal OUTPUT of output buffer 306. In accordance with an exemplary embodiment, a slew rate control circuit comprises a first amplifier circuit for controlling the slew rate of the input signal provided to the pull-up element of the output driver circuit, and a second amplifier circuit for controlling the slew rate of the input signal provided to the pull-down element of the output driver circuit. However, an exemplary slew rate control circuit can comprise any configuration for controlling the slew rate of the input signals for an output driver circuit based on the level of voltage of a power supply for the output driver circuit, including a single amplifier circuit, or multiple amplifier circuits, for controlling one or both of the input signals provided to the pull-up and/or pull-down elements of the output driver circuit.

Figure 4:
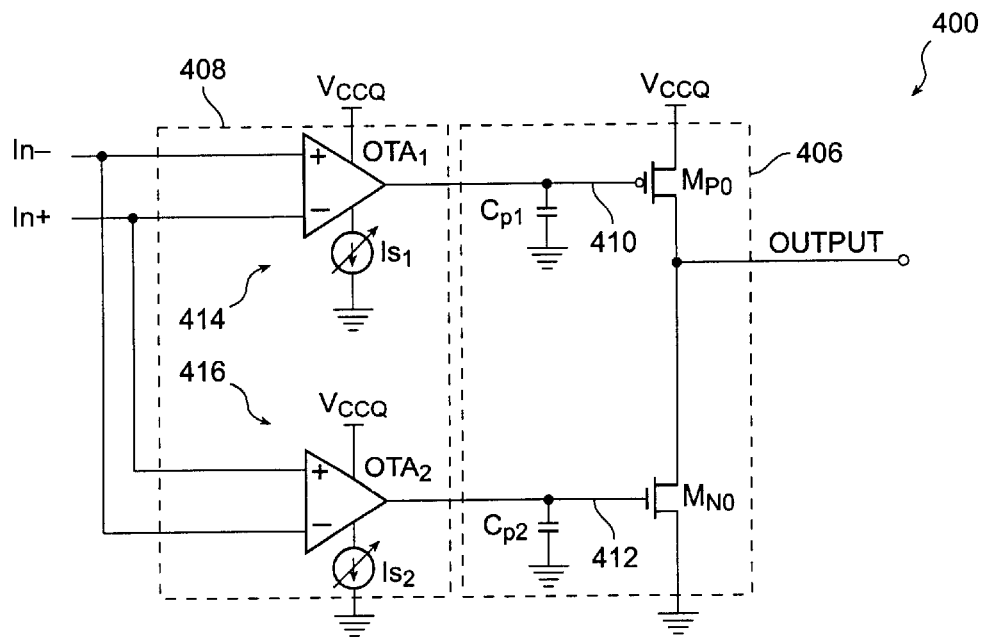
FIG. 4 illustrates a block diagram of an exemplary output buffer having a slew rate control circuit in accordance with an exemplary embodiment of the present invention.

With reference to FIG. 4, in accordance with an exemplary embodiment, an output buffer 400 comprises an output driver circuit 406 and a slew rate control circuit 408. Slew rate control circuit 408 comprises a first amplifier circuit 414 and a second amplifier circuit 416. In accordance with the exemplary embodiment, first amplifier circuit 414 and a second amplifier circuit 416 comprise operational transconductance amplifiers $OTA_1$ and $OTA_2$, respectively. In this exemplary embodiment, the pull-up and pull-down signals, as may be provided from a predriver circuit, such as predriver circuits 302 and 304, have been converted to differential input signals IN⁻ and IN⁺; however, the pull-up and pull-down signals can also be configured as single-ended input signals. Amplifiers $OTA_1$ and $OTA_2$ are configured for receiving differential input signals IN⁻ and IN⁺, with a positive input terminal coupled to input signal IN⁻, and a negative input terminal coupled to IN⁺. The output terminals of operational transconductance amplifiers $OTA_1$ and $OTA_2$ are coupled to pull-up transistor $M_{P0}$ and pull-down transistor $M_{N0}$ to provide pull-up input signal 410 and pull-down input signal 412, respectively. Operational transconductance amplifiers $OTA_1$ and $OTA_2$ are configured to control pull-up input signal 410 and pull-down input signal 412 independently, i.e., without affecting one another. In addition, the output terminals of operational transconductance amplifiers $OTA_1$ and $OTA_2$ are coupled to parasitic capacitances of pull-up transistor $M_{P0}$ and pull-down transistor $M_{N0}$, represented as $C_{P1}$ and $C_{P2}$, respectively.

Although in the exemplary embodiment the pair of amplifier circuits 414 and 416 comprise a pair of operational transconductance amplifiers $OTA_1$ and $OTA_2$, amplifier circuits 414 and 416 can comprise any other types of amplifiers for suitably controlling the slew rate of input signals 410 and 412. In addition, while amplifier circuits 414 and 416 include two amplifiers $OTA_1$ and $OTA_2$, an exemplary slew rate control circuit 408 can comprise additional or fewer amplifiers. For example, with momentary reference to FIG. 6, an exemplary slew rate control circuit 608 can comprise a first amplifier circuit including a p-channel differential pair circuit 614 and an n-channel differential pair circuit 618, and a second amplifier circuit including a p-channel differential pair circuit 622 and an n-channel differential pair circuit 626.

With reference again to FIG. 4, first amplifier circuit 410 and second amplifier circuit 412 can also be configured with current sources configured to facilitate control of the slew rate of input signals 410 and 412 provided to the pull-up and pull-down elements of output driver circuit 406 based on the level in voltage in the power supply. For example, in accordance with the exemplary embodiment, operational transconductance amplifiers $OTA_1$ and $OTA_2$ can be configured with a pair of voltage-controlled current sources $I_{S1}$ and $I_{S2}$, respectively. Voltage-controlled current sources $I_{S1}$ and $I_{S2}$ are configured for controlling biasing current for amplifiers $OTA_1$ and $OTA_2$ based on the level of the voltage of power supply $V_{CCQ}$. Voltage-controlled current sources $I_{S1}$ and $I_{S2}$ can be suitably varied to control the biasing current for amplifiers $OTA_1$ and $OTA_2$, and thus control the slew rate of input signals 410 and 412 for output driver circuit 406 based on the level of the voltage of power supply $V_{CCQ}$. For example, the slew rate of pull-up signal 410 can be determined by the current of current source $I_{S1}$ divided by the capacitance of parasitic capacitor $C_{P1}$, i.e., $PU_{SLEW}=I_{S1}/C_{P1}$; likewise, the slew rate of pull-down signal 412, i.e., $PD_{SLEW}$, can be determined by $IS_2/C_{P2}$.

Accordingly, if the current in current source $I_{S1}$ is suitably decreased when the level of voltage of power supply $V_{CCQ}$ is increased, the slew rate of input signal 410 will decrease. This decrease in the slew rate of input signal 410 can be configured to suitably offset or otherwise cancel the increase in the slew rate of output signal OUTPUT caused by increases in the level of voltage of power supply $V_{CCQ}$. On the other hand, if the current in current source $I_{S1}$ is suitably increased when the voltage of power supply $V_{CCQ}$ is decreased, the slew rate of input signal 410 will increase, resulting in the offset or otherwise cancellation of any decrease in the slew rate of output signal OUTPUT caused by decreases in the voltage of power supply $V_{CCQ}$. As a result, the slew rate variation of output signal OUTPUT can be minimized despite variations or changes in the voltage level in power supply $V_{CCQ}$, for example, to a variance of approximately 10% to 15% or less, as compared to 40% or 50% or more for prior art output buffers. Further, the slew rate variation of output signal OUTPUT of output buffer 400 can be controlled over a greater range of voltage for power supply $V_{CCQ}$, for example from approximately 2.2 volts to 2.8 volts, as opposed to a 2.3 volt to 2.7 volt specification of prior art output buffers.

Although operational transconductance amplifiers $OTA_1$ and $OTA_2$ are configured in the exemplary embodiment with a pair of voltage-controlled current sources $I_{S1}$ and $I_{S2}$, additional current sources can be provided for controlling biasing current for amplifiers $OTA_1$ and $OTA_2$ based on the level of the voltage of power supply $V_{CCQ}$, e.g., operational transconductance amplifier $OTA_1$ can be configured with a pair of voltage-controlled current sources $I_{S1A}$ and $I_{S1B}$, or additional voltage-controlled current sources $I_{S1X}$. In addition, with momentary reference again to FIG. 6, an exemplary slew rate control circuit 608 can comprise a first amplifier circuit including a current source 616 for p-channel differential pair circuit 614 and a current source 620 for n-channel differential pair circuit 618, and a second amplifier circuit including a current source 624 for p-channel differential pair circuit 622 and a current source 628 for n-channel differential pair circuit 626. Further, voltage-controlled current sources $I_{S1}$ and $I_{S2}$ can be configured in various manners and arrangements for controlling biasing current for the first and second amplifier circuits based on the level of the voltage of power supply $V_{CCQ}$.

Figure 5:
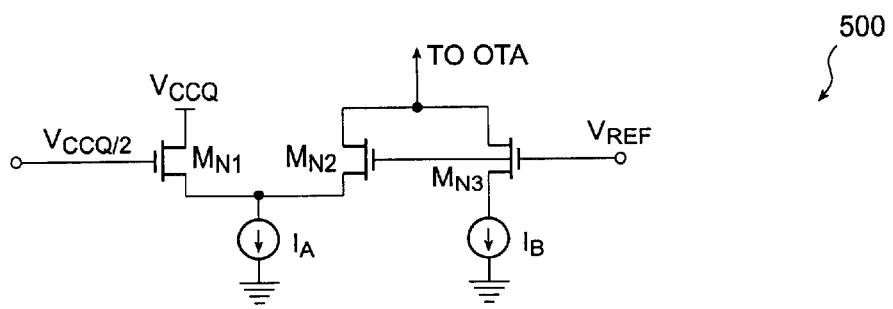
FIG. 5 illustrates a schematic diagram of an exemplary voltage-controlled current source in accordance with an exemplary embodiment of the present invention.

With reference to an exemplary embodiment of FIG. 5, an exemplary voltage-controlled current source 500 suitably comprises a differential pair of transistors $M_{N1}$ and $M_{N2}$, a third transistor $M_{N3}$, and a pair of current sources $I_A$ and $I_B$. Voltage-controlled current source 500 is configured to provide a controlled current $I_S$ for biasing amplifiers $OTA_1$ and $OTA_2$. Although MOSFET devices are implemented in the exemplary embodiment, other transistor-based configurations can be realized, such as other FET or BJT configurations.

The gate terminals of differential pair of transistors $M_{N1}$ and $M_{N2}$ are configured to receive a scaled-down supply voltage $V_{CCQ}/K$ and a reference voltage $V_{REF}$ (which is relatively constant over the entire power supply range). For example, in the exemplary embodiment, the gate terminal of transistor $M_{N1}$ is coupled to a scaled-down supply voltage, e.g., $V_{CCQ}/2$, while the gate terminal of transistor $M_{N2}$ is coupled to a reference voltage $V_{REF}$. The scaled-down supply voltage, e.g., $V_{CCQ}/2$, is assessed to determine the magnitude of the voltage of power supply $V_{CCQ}$, and can be compared to reference voltage $V_{REF}$ to confirm any variations or changes in magnitude, whether due to process or temperature variations, or due to design criteria.

Scaled-down supply voltage $V_{CCQ}/K$ can comprise any other suitably scaling of the voltage of power supply $V_{CCQ}$, for example, between approximately 99.9% and 1% or less of the voltage of power supply $V_{CCQ}$. In addition, reference voltage $V_{REF}$ can comprise various reference voltage levels, for example, between approximately 1.0 volt and 1.5 volts, or any other voltage levels less than or greater than the exemplary voltage. Reference voltage $V_{REF}$ comprises a value corresponding to the scaling of the voltage of power supply $V_{CCQ}$. For example, for an output buffer having a voltage of power supply $V_{CCQ}$ that may vary between approximately 2.2 and 2.8 volts, and with the scaling K of the voltage of power supply $V_{CCQ}$ configured at approximately 2, i.e., power supply $V_{CCQ}$ is scaled down by approximately 50%, a reference voltage $V_{REF}$ may be configured with approximately 1.2 volts. Scaled-down supply voltage $V_{CCQ}/K$ is assessed for any changes in the voltage of power supply $V_{CCQ}$, and can be compared to reference voltage $V_{REF}$ to confirm any such variations.

The respective source terminals of differential pair of transistors $M_{N1}$ and $M_{N2}$ are coupled to current source $I_A$. The drain terminal of transistor $M_{N1}$ is coupled to power supply $V_{CCQ}$. Third transistor $M_{N3}$ also includes a gate terminal coupled to reference voltage $V_{REF}$, and includes a drain terminal coupled to current source $I_B$. The source terminals of transistor $M_{N2}$ and transistor $M_{N3}$ are configured for coupling to amplifiers $OTA_1$ and $OTA_2$. Current sources $I_A$ and $I_B$ can comprise any current source configuration. In the exemplary embodiment, current sources $I_A$ and $I_B$ comprise fixed current sources, at least during operation of slew rate control circuit 408.

Voltage-controlled current source 500 provides a controlled current $I_S$ equal to the current flowing through transistor $M_{N2}$ and transistor $M_{N3}$. The total current flowing through transistors $M_{N1}$ and $M_{N2}$ is equal to the current of current source $I_A$. In the instance where the gate-source voltages $V_{GS}$ of transistors $M_{N1}$ and $M_{N2}$ are equal, the current flowing through each of transistors $M_{N1}$ and $M_{N2}$ is equal to ½ the current of current source $I_A$. The current flowing through transistor $M_{N3}$ is equal to the current of current source $I_B$. Accordingly, under these conditions when the gate-source voltages $V_{GS}$ of transistors $M_{N1}$ and $M_{N2}$ are equal, the total current from voltage-controlled current source 500 is equal to ½ the current of current source $I_A$ plus the current of current source $I_B$, i.e., $I_S = \frac{1}{2}I_A + I_B$.

With reference to FIGS. 4 and 5, for reference voltage $V_{REF}$ equal to 1.2 volts, power supply $V_{CCQ}$ having a voltage of 2.4 volts, and the scaled-down supply voltage, e.g., $V_{CCQ}/2$, equal to 1.2 volts, the voltage at the gates of transistors $M_{N1}$ and $M_{N2}$ are equal. In that the respective source terminals of differential pair of transistors $M_{N1}$ and $M_{N2}$ are coupled to current source $I_A$, and the respective gate terminals have a voltage of approximately 1.2 volts applied, the gate-source voltages $V_{GS}$ of transistors $M_{N1}$ and $M_{N2}$ are equal. As a result, the current flowing through transistors $M_{N1}$ and $M_{N2}$ is approximately equal. Accordingly, the total current $I_S$ from voltage-controlled current source 500 is equal to ½ the current of current source $I_A$ plus the current of current source $I_B$, i.e., $I_S = \frac{1}{2}I_A + I_B$.

In the event that the voltage in power supply $V_{CCQ}$ is decreased, for example to a voltage of 2.2 volts, the scaled-down supply voltage, e.g., $V_{CCQ}/2$, is equal to 1.1 volts, and thus is less than the voltage at reference voltage $V_{REF}$ provided to the gate of transistor $M_{N2}$. As a result, the gate-source voltage $V_{GS}$ of transistor $M_{N1}$ is less than the gate-source voltage $V_{GS}$ of $M_{N2}$, and the current flowing through transistor $M_{N1}$ is less than the current flowing through transistor $M_{N2}$.

Since the total current flowing through transistors $M_{N1}$ and $M_{N2}$ is equal to the current of current source $I_A$, the current flowing through transistor $M_{N2}$ will be greater than ½ the current flowing through current source $I_A$. As a result, the total current from voltage-controlled current source 500 is greater than ½ the current of current source $I_A$ plus the current of current source $I_B$, i.e., $I_S > \frac{1}{2}I_A + I_B$. This increase in current $I_S$ results in increased biasing of amplifiers $OTA_1$ and/or $OTA_2$, thus resulting in an increase in the slew rate of input signals 410 and 412. Accordingly, a corresponding increase in the slew rate of output signal OUTPUT for output driver circuit 406 can be realized to offset decreases in the slew rate caused by decreases in the voltage of power supply $V_{CCQ}$.

On the other hand, in the event that the voltage in power supply $V_{CCQ}$ is increased from a voltage of 2.4 volts, for example to a voltage of 2.6 volts, the scaled-down supply voltage, e.g., $V_{CCQ}/2$, is equal to 1.3 volts, and thus is greater than the voltage at reference voltage $V_{REF}$ provided to the gate of transistor $M_{N2}$. As a result, the gate-source voltage $V_{GS}$ of transistor $M_{N1}$ is greater than the gate-source voltage $V_{GS}$ of $M_{N2}$, and the current flowing through transistor $M_{N1}$ is greater than the current flowing through transistor $M_{N2}$.

Again, since the total current flowing through transistors $M_{N1}$ and $M_{N2}$ is equal to the current of current source $I_A$, the current flowing through transistor $M_{N2}$ will be less than ½ the current flowing through current source $I_A$. As a result, the total current from voltage-controlled current source 500 is less than ½ the current of current source $I_A$ plus the current of current source $I_B$, i.e., $I_S<½I_A+I_B$. This decrease of current $I_S$ results in decreased biasing of amplifiers $OTA_1$ and/or $OTA_2$, thus resulting in a decrease in the slew rate of input signals 410 and 412. Accordingly, a corresponding decrease in the slew rate of output signal OUTPUT for output driver circuit 406 can be realized to offset increases in the slew rate caused by increases in the voltage of power supply $V_{CCQ}$.

Voltage-controlled current sources $I_{S1}$, and $I_{S2}$ can be configured in various manners for controlling the biasing current for amplifiers $OTA_1$ and $OTA_2$. For example, the scaling of the device areas and/or sizes of the various transistors, the sizes of the current sources, or the sizes and characteristics of other components can be suitably modified to provide various levels of biasing for given changes in the voltage of power supply $V_{CCQ}$.

With reference to voltage-controlled current source 500, for example, scaled-down supply voltage $V_{CCQ}/K$ provided to the gate of transistor $M_{N1}$ can be configured in other scaling arrangements besides $V_{CCQ}/2$, e.g., $V_{CCQ}/3$, $V_{CCQ}/4$, $V_{CCQ}/5$ or less. In other words, scaled-down supply voltage $V_{CCQ}/K$ can be configured in any other scaling arrangement. However, while K can be less than 1, values greater than 1 provide a scaled-down voltage that may be more desirable to operation of voltage-controlled current source 500. Further, the value K can be suitably selected based on desired voltage levels to be compared to the voltage at reference voltage $V_{REF}$. The scaling of supply voltage $V_{CCQ}$ to provide scaled-down supply voltage $V_{CCQ}/K$ can be suitably generated by a scaling circuit, such as a scaling circuit 604 illustrated in FIG. 6, or any other scaling circuit configuration.

In addition, reference voltage $V_{REF}$ can be suitably adjusted to different levels to cause the increasing or decreasing of current $I_S$ provided for the biasing of amplifiers $OTA_1$ and/or $OTA_2$. For example, higher/lower voltage levels of reference voltage $V_{REF}$ can require higher/lower voltage levels of scaled-down supply voltage $V_{CCQ}/K$ to be obtained before the current flowing within transistor $M_{N2}$ is decreased/increased, i.e., before current $I_S$ is decreased/increased, and thus before the slew rate of input signals 410 and 412 is decreased/increased. Further, the device areas, e.g., the width/length (W/L) ratios, of transistors $M_{N1}$ and $M_{N2}$ can be suitably scaled to change the relative proportions of current from current source $I_A$ that flow through transistors $M_{N1}$ and $M_{N2}$ for a given scaled-down supply voltage $V_{CCQ}/K$ and reference voltage $V_{REF}$. Still further, current sources $I_A$ and $I_B$ can be suitably scaled in various fixed amounts. In accordance with an exemplary embodiment, current source $I_A$ can comprise a current source having an average, fixed current of between approximately 100 µA and 1 µA, while current source $I_B$ can comprise a current source having an average, fixed current of between approximately 300 µA and 700 µA, e.g., approximately 500 µA. Moreover, while current sources $I_A$ and $I_B$ can be suitably maintained at a constant value during operation, current sources $I_A$ and $I_B$ can also be suitably tuned or adjusted to different levels prior to, or during operation.

Accordingly, voltage-controlled current sources $I_{S1}$ and $I_{S2}$, for example voltage-controlled current sources 500, can be configured in various manners for controlling the biasing current for amplifiers $OTA_1$ and $OTA_2$, and thus the adjustment of the slew rate of input signals 410 and 412. These adjustments of the scaling of the device areas and/or sizes of the various transistors, the sizes of the current sources, or the sizes and characteristics of other components can be suitably configured based on the amount of slew rate modification of input signals 410 and 412 desired for given changes in the voltage of power supply $V_{CCQ}$.

An exemplary slew rate control circuit, such as slew rate control circuits 308 and 408, can comprise various other configurations for controlling the slew rate of the input signals for an output driver circuit based on the voltage of a power supply for the output driver circuit, and can include various other circuits and components to facilitate predriving, scaling, or signal or reference voltage generating mechanisms.

Figure 6:
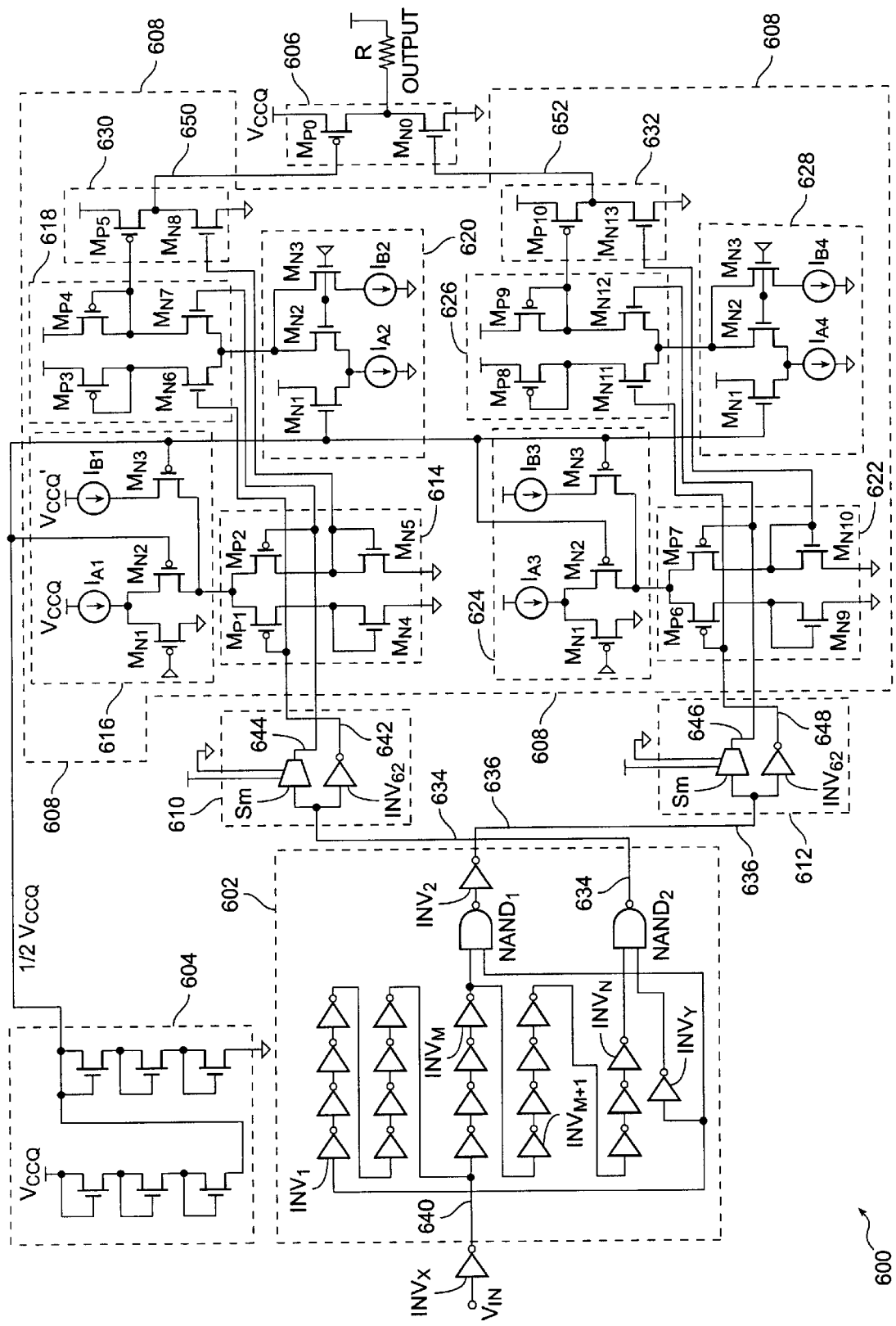
FIG. 6 illustrates a schematic diagram of an output buffer having a slew rate control circuit in accordance with an exemplary embodiment of the present invention.

For example, with reference to FIG. 6, an exemplary embodiment of an output buffer circuit 600 is illustrated. An output buffer circuit 600 suitably comprises predriver circuit 602, an output driver circuit 606, and a slew rate control circuit 608. Predriver circuit 602 is configured for providing a pull-up signal 634 for controlling and driving a pull-up transistor $M_{P0}$ of output driver circuit 606, and a pull-down signal 636 for controlling and driving a pull-down transistor $M_{N0}$ of output driver circuit 606. Predriver circuit 602 can comprise various logic devices and components for providing pull-up and/or pull-down signals 634 and 636. For example, predriver circuit 602 comprises a pair of inverter devices in series such as predriver circuits 302 and 304, and/or various other AND gates, NAND gates, OR gates, exclusive-OR gates, in series and/or parallel to provide pull-up and/or pull-down signals 634 and 636.

In the exemplary embodiment illustrated in FIG. 6, predriver circuit 602 comprises an input terminal 640 receiving an input signal $V_{IN}$ through an inverter $I_X$, with input terminal 640 coupled through a series of inverters $INV_1$ through $INV_M$ to an input of a $NAND_1$ gate, and coupled directly to $NAND_1$ gate. An output of $NAND_1$ gate is coupled to an inverter $INV_Z$ to provide pull-down signal 636. To provide a pull-up signal 634, a $NAND_2$ gate has an input terminal coupled through an inverter $INV_Y$ to input terminal 640, and another input terminal coupled to the output of inverter $INV_M$ through a series of inverters $INV_{M+1}$ through $INV_N$. Again, however, various other logic devices can be included, modified, rearranged, or removed to provide pull-up and/or pull-down signals 634 and 636.

Output driver circuit 606 suitably comprises a pull-up transistor $M_{P0}$ and a pull-down transistor $M_{N0}$ for driving an output signal OUTPUT, for example to a load R. The device areas of pull-up transistor $M_{P0}$ and pull-down transistor $M_{N0}$ can be scaled in various arrangements. Moreover, while output driver circuit 606 illustrates a p-channel pull-up transistor and an n-channel pull-down transistor, output driver circuit 606 can also suitably comprise a pair of n-channel devices, or multiple n-channel and p-channel devices. Further, output driver circuit 606 can also suitably comprise other types of transistor devices, such as bipolar-junction transistors (BJT's). Accordingly, output driver circuit 606 can comprise any output driver configuration for driving an output signal OUTPUT.

In the exemplary embodiment, slew rate control circuit 608 comprises a first amplifier circuit and a second amplifier circuit, each including two differential input pairs, e.g., the first amplifier circuit comprises p-channel differential pair circuit 614 and n-channel differential pair circuit 618 configured with voltage-controlled current sources 616 and 620, respectively, and the second amplifier circuit comprises p-channel differential pair circuit 622 and n-channel differential pair circuit 626 configured with voltage-controlled current sources 624 and 628, respectively. To generate a differential input signal from each of pull-up and/or pull-down signals 634 and 636 for the first and second amplifier circuits, output buffer circuit 600 can also comprise differential signal generator circuits 610 and 612.

Differential signal generator circuits 610 and 612 can be configured in various arrangements. In the exemplary embodiment, differential signal generator 610 comprises a transmission gate $g_m$ and an inverter $INV_{G1}$ configured to receive pull-up signal 634 and generate differential signals 642 and 644, while differential signal generator 612 comprises a transmission gate gm and an inverter $INV_{G2}$ configured to receive pull-down signal 636 and generate differential signals 646 and 648. However, any other circuit configuration for generating a differential signal from a single-ended output signal can be provided for differential signal generator circuits 610 and 612.

With respect to the first amplifier circuit, p-channel differential pair circuit 614 comprises an input differential pair of p-channel devices $M_{P1}$ and $M_{P2}$ having gate terminals coupled to differential signals 642 and 644, source terminals coupled to voltage-controlled current source 616, and drain terminals coupled to ground through a pair of n-channel devices $M_{N4}$ and $M_{N5}$, while n-channel differential pair circuit 618 comprises an input differential pair of n-channel devices $M_{N6}$ and $M_{N7}$ having gate terminals coupled to differential signals 642 and 644, source terminals coupled to voltage-controlled current source 620, and drain terminals coupled to power supply $V_{CCQ}$ through a pair of p-channel devices $M_{P3}$ and $M_{P4}$. With respect to the second amplifier circuit, p-channel differential pair circuit 622 comprises a differential pair of p-channel devices $MP_6$ and $MP_7$ having gate terminals coupled to differential signals 642 and 644, source terminals coupled to voltage-controlled current source 624, and drain terminals coupled to ground through a pair of n-channel devices $M_{N9}$ and $M_{N10}$, while n-channel differential pair circuit 626 comprises an input differential pair of n-channel devices $M_{N11\ and\ MN12}$ having gate terminals coupled to differential signals 642 and 644, source terminals coupled to voltage-controlled current source 628, and drain terminals coupled to power supply $V_{CCQ}$ through a pair of p-channel devices $M_{P8}$ and $M_{P9}$. Although dual p-channel/n-channel pair configurations are illustrated in the exemplary embodiments for p-channel differential pair circuits 614 and 622 and n-channel differential pair circuits 618 and 626, other differential pair configurations can be suitably implemented.

Voltage-controlled current sources 616 and 620 and voltage-controlled current sources 624 and 628 are configured for controlling biasing current for the first and second amplifier circuits, respectively, based on changes in the voltage of power supply $V_{CCQ}$. In this exemplary embodiment, voltage-controlled current sources 616, 620, 624 and 628 comprise current sources similar in configuration to exemplary voltage-controlled current source 500; voltage-controlled current sources 620 and 628 have current sources $I_A$ and $I_B$ coupled to ground, while voltage-controlled current sources 616 and 624 have current sources $I_A$ and $^1B$ coupled to power supply $V_{CCQ}$. However, any other current source configuration for controlling biasing current for the first and second amplifier circuits, based on the level of the voltage of power supply $V_{CCQ}$ can be suitably implemented.

To generate a reference voltage, e.g., reference voltage $V_{REF}$, for voltage-controlled current sources 616, 620, 624 and 628, e.g., for coupling to the gates of transistors $M_{N1}$ of current sources 616 and 624, or to the gates of transistors $M_{N3}$ of current sources 620 and 628, output buffer circuit 600 can be coupled to a reference generating circuit. The reference generating circuit can comprise, for example, a bandgap voltage reference circuit configured to provide a selected reference voltage $V_{REF}$, or any other reference generating circuit, arrangement or device configured to provide a selected reference voltage $V_{REF}$.

For the scaling of supply voltage $V_{CCQ}$ to provide scaled-down supply voltage $V_{CCQ}/K$ to voltage-controlled current sources 616, 620, 624 and 628, output buffer circuit 600 can include a scaling circuit, such as a scaling circuit 604. In the exemplary embodiment, scaling circuit comprises a series of transistors configured in resistor divider network and coupled to supply voltage $V_{CCQ}$ to provide scaled-down supply voltage $V_{CCQ}/K$ to voltage-controlled current sources 616, 620, 624 and 628. The appropriate scaling K can be suitably configured by the number and device areas of the various transistors configured in the resistor divider network. Although transistor devices are illustrated in the resistor divider network, any other component or device, for example, resistors, capacitors and the like, can be suitably implemented in a resistor divider network. Further, scaling circuit 604 is not limited to resistor divider network configurations, and can comprise any circuit, device or configuration for generating scaled-down supply voltage $V_{CCQ}/K$ to voltage-controlled current sources 616, 620, 624 and 628.

To provide controlled slew rate drive signals to output driver circuit 606, the first and second amplifier circuits comprise output stage circuits 630 and 632, respectively. Output stage circuit 630 comprises a pull-up transistor $M_{P5}$ and a pull-down transistor $M_{N8}$, while output stage circuit 632 comprises a pull-up transistor $M_{10}$ and a pull-down transistor $M_{N13}$. Output stage circuit 630 is configured to receive controlled signals from p-channel differential pair circuit 614 and n-channel differential pair circuit 618, and is configured to provide a controlled drive signal 650 to output drive circuit 606, i.e., to pull-up transistor $M_{P0}$. Output stage circuit 632 is configured to receive controlled signals from p-channel differential pair circuit 622 and n-channel differential pair circuit 626, and is configured to provide a controlled drive signal 652 to output drive circuit 606, i.e., to pull-up transistor $M_{N0}$. While output stage circuits 630 and 632 are configured for receiving a pair of drive signals from a pair of p-channel/n-channel circuits in the exemplary embodiment, output stage circuits 630 and 632 can be configured to receive only a single drive signal. Moreover, output buffer circuit 600 can be suitably configured to provide drive signals 650 and 652 directly from one or more p-channel differential pair circuits and/or n-channel differential pair circuits, or other amplifier circuits.

During operation, predriver circuit 602 can provide pull-up signal 634 and pull-down signal 636 to the first and second amplifier circuits through differential signal generator circuits 610 and 612. Slew rate control circuit 608 is configured to provide controlled input signals 650 and 652 to output driver circuit 606, with the slew rate of input signals 650 and 652 being controlled by the first and second amplifier circuits based on the level of voltage of power supply $V_{CCQ}$. Current sources 616, 620, 624 and 628 are configured to compare scaled-down supply voltage $V_{CCQ}/K$ to reference voltage $V_{REF}$, and then suitably increasing or decreasing the biasing current to the first amplifier circuit comprising p-channel differential pair circuit 614 and n-channel differential pair circuit 618 and the biasing current to the second amplifier circuit comprising p-channel differential pair circuit 622 and n-channel differential pair circuit 626. As a result, the slew rate of input signals 650 and 652 can be suitably increased/decreased, resulting in the offset or otherwise cancellation of any increase or decrease in the slew rate of output signal OUTPUT caused by decreases in the voltage of power supply $V_{CCQ}$. Accordingly, the slew rate of output signal OUTPUT can be maintained substantially constant despite variations or changes in the voltage level in power supply $V_{CCQ}$.

The present invention has been described above with reference to various exemplary embodiments. However, various other changes and modifications may be made to the exemplary embodiments without departing from the scope of the present invention. In addition, any type of transistor devices configured for performing the intended functions can be utilized. These and other changes or modifications are intended to be included within the scope of the present invention, as set forth in the following claims.

What is claimed is:

1. An output buffer configured for use within DRAM applications, said output buffer comprising:
    a predriver circuit configured for providing a drive input signal;
    an output driver circuit configured for providing an output signal for said output buffer, said output driver circuit coupled to a power supply; and
    a slew rate control circuit coupled between said predriver circuit and said output driver circuit and configured for controlling a slew rate of said drive input signal based on a level of voltage in said power supply provided to said output driver circuit.

2. An output buffer configured for use within DRAM applications, said output buffer comprising:
    a predriver circuit configured for providing a drive input signal;
    an output driver circuit configured for providing an output signal for said output buffer, wherein said output driver circuit comprises:
        a pull-up transistor having a source terminal configured for coupling to the power supply, and a gate terminal coupled to said slew rate control circuit; and
        a pull-down transistor having a source terminal configured for coupling to a ground connection, a drain terminal coupled to a drain terminal of said pull-up transistor, and a gate terminal coupled to said slew rate control circuit; and
    a slew rate control circuit coupled between said predriver circuit and said output driver circuit and configured for controlling a slew rate of said drive input signal based on a level of voltage in a power supply provided to said output driver circuit.

3. The output buffer according to claim 2, wherein said output buffer further comprises a predriver circuit configured for providing a drive input signal, said predriver circuit comprising:
    a pull-up predriver circuit for providing a pull-up input signal for controlling said pull-up transistor of said output driver circuit; and
    a pull-down predriver circuit for providing a pull-down input signal for controlling said pull-down transistor of said output driver circuit.

4. An output buffer configured for use within DRAM applications, said output buffer comprising:
    a predriver circuit configured for providing a drive input signal;
    an output driver circuit configured for providing an output signal for said output buffer, and
    a slew rate control circuit coupled between said predriver circuit and said output driver circuit and configured for controlling a slew rate of said drive input signal based on a level of voltage in a power supply provided to said output driver circuit, wherein said slew rate control circuit comprises:
        a first amplifier circuit configured for controlling a slew rate of a pull-up input signal and providing said controlled pull-up input signal to said output driver circuit; and
        a second amplifier circuit configured for controlling a slew rate of a pull-down input signal and providing said controlled pull-down input signal to said output driver circuit.

5. The output buffer according to claim 4, wherein said first amplifier circuit comprises a first operational transconductance amplifier.

6. The output buffer according to claim 5, wherein said second amplifier circuit comprises a second operational transconductance amplifier.

7. The output buffer according to claim 6, wherein said first operational transconductance amplifier is configured with a first voltage-controlled current source, and said second operational transconductance amplifier is configured with a second voltage-controlled current source.

8. The output buffer according to claim 7, wherein said first voltage-controlled current source and said second voltage-controlled current source are configured for controlling biasing current for said first operational transconductance amplifier and said second operational transconductance amplifier based on voltage changes of the power supply.

9. The output buffer according to claim 7, wherein said first voltage-controlled current source and said second voltage-controlled current source are configured for receiving a voltage signal representative of voltage in the power supply and for comparison of said representative voltage signal to a reference voltage signal.

10. The output buffer according to claim 9, wherein at least one of said first voltage-controlled current source and said second voltage-controlled current source comprises:
    a differential pair of transistors comprising a first transistor and a second transistor, said first transistor having a gate terminal coupled to said representative voltage signal and a drain coupled to the power supply, said second transistor having a gate terminal coupled to said reference voltage signal and a drain terminal coupled to a source terminal of said first transistor;
    a first fixed current source coupled to said source terminals of said first transistor and said second transistor;
    a third transistor having a drain terminal coupled to a drain terminal of said second transistor and further coupled to one of said first operational transconductance amplifier and said second operational transconductance amplifier, and a gate terminal coupled to said reference voltage signal; and
    a second fixed current source coupled to a drain terminal of said third transistor.

11. The output buffer according to claim 10, wherein said output buffer further comprises a supply voltage generation circuit for generating a said representative voltage signal, said supply voltage generation circuit coupled to said at least one of said first voltage-controlled current source and said second voltage-controlled current source.

12. The output buffer according to claim 11, wherein said supply voltage generation circuit comprises a resistor divider circuit.

13. The output buffer according to claim 4, wherein said output buffer further comprises a first differential signal generator circuit configured for generating a differential input signal from said pull-up input signal, and providing said differential input signal to said first amplifier circuit.

14. A slew rate control circuit for controlling the slew rate of an output signal of an output buffer, said slew rate control circuit comprising:
a first amplifier circuit for receiving a first input drive signal and controlling a slew rate of said first input drive signal based on changes in voltage of a power supply coupled to the output buffer;
a first current source coupled to said first amplifier circuit, said first current source configured for providing a first biasing current to said first amplifier circuit to facilitate control of said slew rate of said first input drive signal;
a second amplifier circuit for receiving a second input drive signal and controlling a slew rate in said second input drive signal based on changes in voltage of the power supply coupled to the output buffer; and
a second current source coupled to said second amplifier circuit, said second current source configured for providing a second biasing current to said second amplifier circuit to facilitate control of said slew rate of said second input drive signal.

15. The slew rate control circuit according to claim 14, wherein said first current source is configured to adjust said first biasing current based on a level of voltage in the power supply to facilitate control of the slew rate of the output signal of the output buffer.

16. The slew rate control circuit according to claim 15, wherein said first current source is configured to decrease said first biasing current when said level of voltage in the power supply increases, and to increase said first biasing current when said level of voltage in the power supply decreases, to facilitate control of the slew rate of the output signal of the output buffer.

17. The slew rate control circuit according to claim 16, wherein said second current source is configured to decrease said second biasing current when said level of voltage in the power supply increases, and to increase said second biasing current when said level of voltage in the power supply decreases, to facilitate control of the slew rate of the output signal of the output buffer.

18. The slew rate control circuit according to claim 15, wherein said first current source is configured to compare a voltage signal representative of voltage in the power supply with a reference voltage signal to determine whether to adjust said first biasing current.

19. The slew rate control circuit according to claim 14, wherein said first amplifier circuit comprises a first operational transconductance amplifier and said second amplifier circuit comprises a second operational transconductance amplifier.

20. The slew rate control circuit according to claim 19, wherein said first current source comprises a first voltage-controlled current source and said second current source comprises a second voltage-controlled current source.

21. The slew rate control circuit according to claim 14, wherein at least one of said first amplifier circuit and said second amplifier circuit comprises a first differential pair input circuit and a second differential pair input circuit.

22. The slew rate control circuit according to claim 21, wherein said first differential pair input circuit and said second differential pair input circuit are configured to provide differential input terminals to said at least one of said first amplifier circuit and said second amplifier circuit.

23. The slew rate control circuit according to claim 21, wherein said first differential pair input circuit comprises a p-channel differential input pair of transistors and said second differential pair input circuit comprises an n-channel differential input pair of transistors.

24. The slew rate control circuit according to claim 21, wherein said first differential pair input circuit is coupled to a voltage-controlled current source and said second differential pair input circuit is coupled to another voltage-controlled current source.

25. The slew rate control circuit according to claim 14, wherein said first amplifier circuit comprises a first output stage circuit, and said second amplifier circuit comprises a second output stage circuit.

26. The slew rate control circuit according to claim 20, wherein at least one of said first current source and said second current source comprises:
a differential pair of transistors comprising a first transistor and a second transistor, said first transistor coupled to said representative voltage signal and to the power supply, said second transistor coupled to said reference voltage signal;
a first fixed current source coupled to an output of said first transistor and said second transistor;
a third transistor coupled to said second transistor and to one of said first operational transconductance amplifier and said second operational transconductance amplifier, and further coupled to said reference voltage signal; and
a second fixed current source coupled to a said third transistor.

27. A method for slew rate regulation of an output signal in an output buffer, said method comprising the steps of:
receiving in a slew rate control circuit an input drive signal from a predriver circuit;
determining a level of voltage of a power supply for said output buffer; and
controlling said slew rate of said output signal through adjustment of a slew rate of said input drive signal based on said level of voltage of the power supply.

28. The method according to claim 27, wherein said steps of determining said level of voltage of the power supply for said output buffer and comparing said level of voltage of the power supply with said reference voltage are conducted within a voltage-controlled current source.

29. The method according to claim 27, wherein said step of determining said level of voltage of said power supply comprises scaling down voltage of said power supply to provide said level of voltage.

30. The method according to claim 27, wherein said step of controlling said slew rate comprises adjustment of a slew rate in at least one of a pull-up drive signal and a pull-down drive signal.

31. A method for slew rate regulation of an output signal in an output buffer, said method comprising the steps of:
receiving in a slew rate control circuit an input drive signal from a predriver circuit;

determining a level of voltage of a power supply for said output buffer;

comparing said level of voltage of said power supply with a reference voltage; and controlling said slew rate of said output signal through adjustment of a slew rate of said input drive signal based on said level of voltage of the power supply.

32. A method for slew rate regulation of an output signal in an output buffer, said method comprising the steps of:

receiving in a slew rate control circuit an input drive signal from a predriver circuit;

determining a level of voltage of a power supply for said output buffer;

controlling said slew rate of said output signal through adjustment of a slew rate of said input drive signal based on said level of voltage of the power supply, wherein said step of controlling said slew rate of said output signal comprises at least one of the steps of:

increasing a bias current in an amplifier circuit of said slew rate control circuit when said level of voltage of the power supply is less than a reference voltage; and decreasing a bias current in an amplifier circuit of said slew rate control circuit when said level of voltage of the power supply is greater than a reference voltage.

33. An DRAM output buffer comprising:

a predriver circuit configured for providing a pull-up input signal and a pull-down input signal;

an output driver circuit configured for providing an output signal; and a slew rate control circuit configured for controlling a slew rate of said pull-up input signal and said pull-down input signal based on levels of voltage of a power supply coupled to said output driver circuit, and configured for providing a controlled pull-up signal and a controlled pull-down signal to said output driver circuit.

34. The DRAM output buffer according to claim 33, wherein said slew rate control circuit comprises:

a first amplifier circuit for receiving said pull-up input signal and controlling a slew rate of said pull-up input signal based on changes in voltage of the power supply coupled to the output buffer;

a first current source coupled to said first amplifier circuit, said first current source configured for providing a first biasing current to said first amplifier circuit to facilitate control of said slew rate of said pull-up input signal;

a second amplifier circuit for receiving said pull-down input signal and controlling a slew rate in said pull-down input signal based on changes in voltage of the power supply coupled to the output buffer; and a second current source coupled to said second amplifier circuit, said second current source configured for providing a second biasing current to said second amplifier circuit to facilitate control of said slew rate of said pull-down input signal.

35. The DRAM output buffer according to claim 34, wherein at least one of said first current source and said second current source comprises:

a differential pair of transistors comprising a first transistor and a second transistor, said first transistor coupled to said representative voltage signal and to the power supply, said second transistor coupled to said reference voltage signal;

a first fixed current source coupled to an output of said first transistor and said second transistor;

a third transistor coupled to said second transistor and to one of said first operational transconductance amplifier and said second operational transconductance amplifier, and further coupled to said reference voltage signal; and a second fixed current source coupled to a said third transistor.

36. A memory system having an output buffer configured for providing an operating voltage to a memory device, said output buffer comprising:

an output driver circuit configured for providing an output signal, said output driver circuit coupled to a power supply; and a slew rate control circuit configured for receiving input control signals and for providing controlled drive signals to said output driver circuit, said slew rate control circuit configured for controlling a slew rate of said controlled drive signals based on voltage changes in said power supply coupled to said output driver circuit.

37. The memory system according to claim 36, wherein said slew rate control circuit comprises:

a first amplifier circuit for receiving a pull-up input signal comprising one of said input control signals from said predriver circuit;

a first current source coupled to said first amplifier circuit, said first current source configured for providing a first biasing current to said first amplifier circuit to facilitate control of said slew rate of said pull-up input signal;

a second amplifier circuit for receiving a pull-down input signal comprising another of said input control signals from said predriver circuit; and a second current source coupled to said second amplifier circuit, said second current source configured for providing a second biasing current to said second amplifier circuit to facilitate control of said slew rate of said pull-down input signal.

38. The memory system according to claim 37, wherein said first current source is configured to adjust said first biasing current, and said second current source is configured to adjust said second biasing current, based on comparison of a voltage representative of a level of voltage from the power supply.

39. The memory system according to claim 38, wherein said output buffer further comprises a supply voltage generation circuit for generating said voltage representative of the power supply, said supply voltage generation circuit coupled to said slew rate control circuit.

40. The memory system according to claim 39, wherein said output buffer further comprises a first differential signal generator circuit configured for generating a differential input signal from said pull-up input signal, and providing said differential input signal to said first amplifier circuit.

41. An electronic system comprising a processor, a supply and a memory system, said memory system having an output buffer comprising:

a predriver circuit configured for providing an input signal for controlling said output buffer;

an output driver circuit configured for providing an output signal for said output buffer, said output driver circuit coupled to a power supply; and a slew rate control circuit coupled to said predriver circuit to receive said input signal and to provide a controlled drive signal to said output driver circuit, said slew rate control circuit configured for controlling a slew rate for said controlled drive signal based on voltage level in said power supply coupled to said output driver circuit.

42. The electronic system according to claim 41, wherein said slew rate control circuit comprises:
- an amplifier circuit for receiving said input signal and controlling said slew rate of said controlled drive signal based on said voltage level of the power supply; and
- a current source configured with said amplifier circuit, said current source configured for providing a biasing current to said amplifier circuit to facilitate control of said slew rate of said controlled drive signal through decreases and increases in said biasing current based on increases and decreases in said voltage level of the power supply.

43. The electronic system according to claim 42, wherein said current source comprises:
- a differential pair of transistors comprising a first transistor and a second transistor, said first transistor coupled to said representative voltage signal and to the power supply, said second transistor coupled to said reference voltage signal;
- a first fixed current source coupled to an output of said first transistor and said second transistor;
- a third transistor coupled to said second transistor and to one of said first operational transconductance amplifier and said second operational transconductance amplifier, and further coupled to said reference voltage signal; and
- a second fixed current source coupled to a said third transistor.

44. A slew rate control circuit for controlling the slew rate of an output signal of an output buffer, said slew rate control circuit comprising:
- an amplifier circuit for receiving an input drive signal and controlling a slew rate of said input drive signal based on a level of voltage of a power supply coupled to the output buffer; and
- a current source coupled to said amplifier circuit, said current source configured for providing a biasing current to said amplifier circuit to facilitate control of said slew rate of said input drive signal; and
- wherein said slew rate control circuit is configured to control any increases and decreases in the slew rate of the output signal of the output buffer through decreases and increases in said biasing current.

* * * * *